(12) United States Patent
Lai et al.

(10) Patent No.: US 10,978,445 B2
(45) Date of Patent: Apr. 13, 2021

(54) ELECTROSTATIC DISCHARGE PROTECTION CIRCUIT AND SEMICONDUCTOR CIRCUIT

(71) Applicant: TAIWAN SEMICONDUCTOR MANUFACTURING COMPANY LTD., Hsinchu (TW)

(72) Inventors: Ming-Fang Lai, Hsinchu (TW); Liang-Yu Su, Yunlin County (TW); Hang Fan, Shanghai (CN)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 317 days.

(21) Appl. No.: 15/964,909

(22) Filed: Apr. 27, 2018

(65) Prior Publication Data

US 2019/0237456 A1 Aug. 1, 2019

(30) Foreign Application Priority Data

Jan. 31, 2018 (CN) .......................... 201810094319.3

(51) Int. Cl.
*H02H 9/04* (2006.01)
*H01L 27/02* (2006.01)
(Continued)

(52) U.S. Cl.
CPC ...... *H01L 27/0266* (2013.01); *H01L 27/0285* (2013.01); *H01L 27/0288* (2013.01);
(Continued)

(58) Field of Classification Search
USPC .......................................................... 361/56
See application file for complete search history.

(56) References Cited

U.S. PATENT DOCUMENTS 5,452,171 A 9/1995 Metz et al.
6,424,510 B1 7/2002 Ajit et al.
(Continued)

FOREIGN PATENT DOCUMENTS

CN 103681658 A 3/2014
CN 104836217 A 8/2015
(Continued)

OTHER PUBLICATIONS

Office Action dated Sep. 18, 2018 issued by the Taiwan Intellectual Property Office (TIPO) for counterpart application No. 107111614.
(Continued)

*Primary Examiner* — Danny Nguyen
(74) *Attorney, Agent, or Firm* — WPAT, P.C., Intellectual Property Attorneys; Anthony King

(57) ABSTRACT

The present disclosure provides a electrostatic discharge (ESD) protection circuit, coupled between a first reference terminal and a second reference terminal; the ESD protection circuit includes a first voltage divider, a second voltage divider, a first trigger circuit and a second trigger circuit. The first trigger circuit includes a first terminal and a second terminal, wherein the first terminal is coupled to the first reference terminal, and the second terminal is coupled to the second reference terminal via the first voltage divider. The second trigger circuit includes a first terminal and a second terminal, wherein the first terminal is coupled to the second reference terminal, the second terminal is coupled to the first reference terminal via the second voltage divider, and the second trigger circuit and the first trigger circuit are in parallel connection.

20 Claims, 6 Drawing Sheets

(51) Int. Cl.
    *H01L 27/06*     (2006.01)
    *H03K 17/081*     (2006.01)
    *H01L 29/20*     (2006.01)
    *H01L 29/778*     (2006.01)

(52) U.S. Cl.
    CPC ...... *H01L 27/0605* (2013.01); *H01L 27/0629* (2013.01); *H02H 9/046* (2013.01); *H03K 17/08104* (2013.01); *H01L 29/2003* (2013.01); *H01L 29/778* (2013.01); *H02H 9/04* (2013.01); *H02H 9/044* (2013.01)

(56) References Cited

U.S. PATENT DOCUMENTS

| | | | |
|---|---|---|---|
| 6,459,553 B1* | 10/2002 | Drapkin | H01L 27/0266 257/355 |
| 6,690,555 B1 | 2/2004 | Pasqualini | |
| 7,782,580 B2 | 8/2010 | Gauthier, Jr. et al. | |
| 2003/0076639 A1* | 4/2003 | Chen | H01L 27/0266 361/56 |
| 2009/0021872 A1 | 1/2009 | Ker et al. | |
| 2009/0086391 A1 | 4/2009 | Gauthier, Jr. et al. | |
| 2009/0086394 A1* | 4/2009 | Yasuda | H01L 27/0266 361/56 |
| 2013/0229736 A1 | 9/2013 | Van Der Borght et al. | |
| 2014/0063665 A1 | 3/2014 | Chen et al. | |
| 2015/0214732 A1* | 7/2015 | Haruki | H02H 9/042 361/56 |
| 2015/0229125 A1* | 8/2015 | Kato | H02H 9/046 361/56 |
| 2016/0307886 A1* | 10/2016 | Roberts | H01L 27/0248 |
| 2018/0026029 A1 | 1/2018 | Lin et al. | |

FOREIGN PATENT DOCUMENTS

| | | |
|---|---|---|
| EP | 2515334 A1 | 10/2012 |
| TW | I309470 | 5/2009 |
| TW | I347667 | 8/2011 |
| TW | I447896 | 8/2014 |

OTHER PUBLICATIONS

Notice of Allowance dated May 15, 2019 issued by Taiwan Intellectual Property Office for counterpart application 107111614.
Search Report issued by Taiwan Intellectual Property Office for counterpart application 107111614.
Office Action dated Oct. 26, 2020 from China Patent Office for application No. 201810094319.3.

* cited by examiner

ELECTROSTATIC DISCHARGE PROTECTION CIRCUIT AND SEMICONDUCTOR CIRCUIT

CROSS-REFERENCE TO RELATED APPLICATIONS

This application claims the benefit of priority to Patent Application No. 201810094319.3, filed in China on Jan. 31, 2018; the entirety of which is incorporated herein by reference for all purposes.

BACKGROUND

Gallium nitride (GaN) based devices has been widely applied in commercial applications, in particular, in the high-frequency and high-power applications. However, the GaN based devices often have a smaller gate-to-source breakdown voltage, for example, less than 10 volts. Therefore, the gate of GaN based devices is prone to damage owing to the gate voltage overshoot. Electrostatic discharge is a sudden release of electrostatic charges, which may result in a high electric field and current within the integrated circuit (IC), thereby damaging the GaN based device therewithin.

BRIEF DESCRIPTION OF THE DRAWINGS

Aspects of embodiments of the present disclosure are best understood from the following detailed description when read with the accompanying drawings. It is noted that, in accordance with the standard practice in the industry, various features are not drawn to scale. In fact, the dimensions of the various features may be arbitrarily increased or reduced for the clarity of discussion.

DETAILED DESCRIPTION

Figure 1:
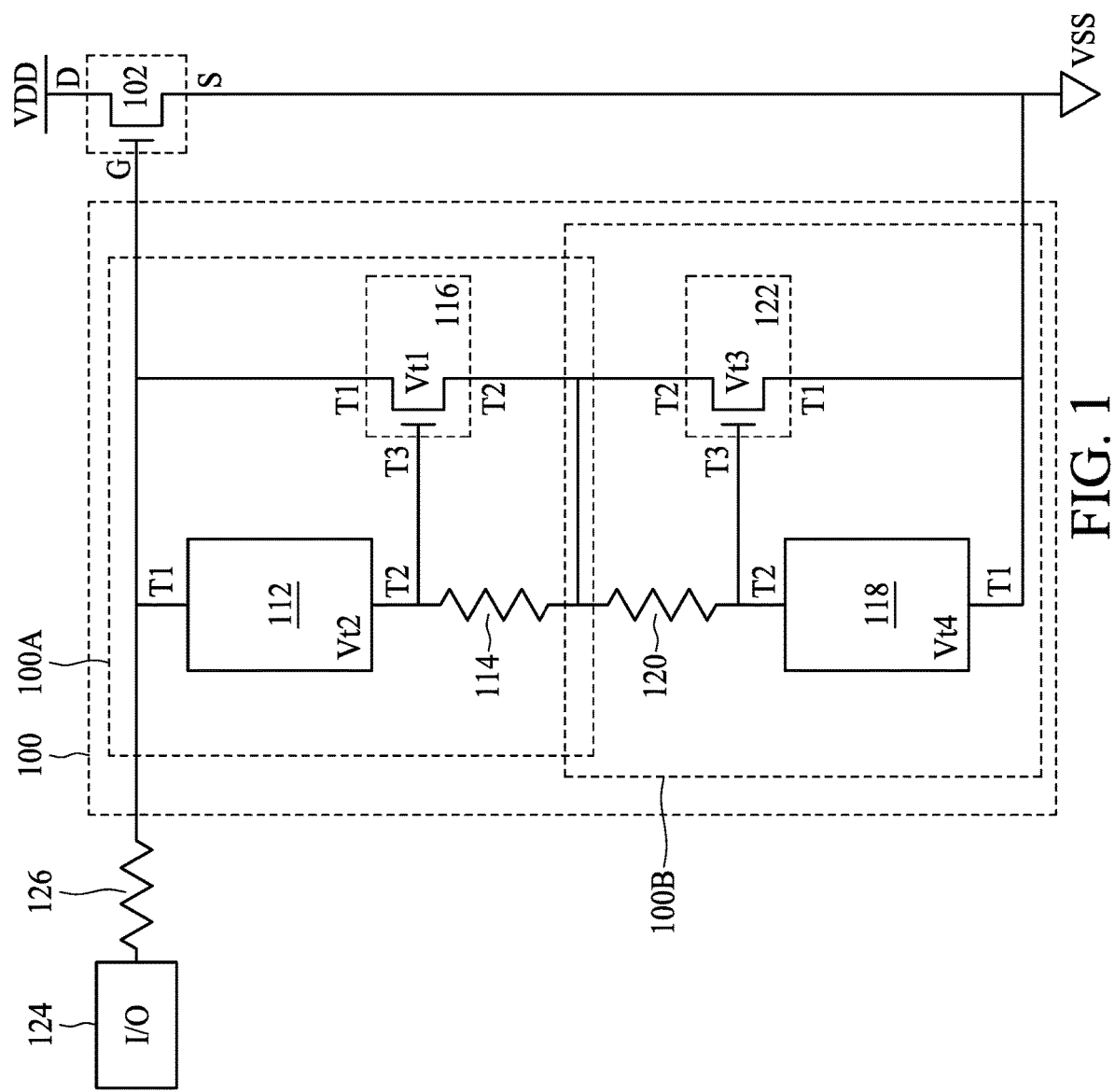
FIG. 1 is a schematic diagram illustrating a GaN based semiconductor component combined with an ESD protection circuit in an IC chip.

The following disclosure provides many different embodiments or examples, for implementing different features of the subject matter of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, reference numerals and/or letters may be repeated in various examples of the present disclosure. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the drawings. The apparatus may be otherwise oriented (e.g., rotated by 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As compared with silicon based metal-oxide-semiconductor field-effect transistors (silicon based MOSFET), the GaN based HEMTs have a lower threshold voltage and smaller gate-to-source source on-state resistance. On the one hand, these features allow for a lower gate driving power and a higher current and switching frequency. On the other hand, the lower gate breakdown voltage of the GaN based HEMT may result in the damage to the gate terminal because the voltage overshot surge exceeds the gate breakdown voltage. Therefore, a gate protection circuit is often used to protect the GaN based HEMT to avoid the damage caused by the voltage overshot surge during the component switching or electrostatic discharge surge.

Reference is made to FIG. 1, which is a schematic diagram illustrating a GaN based semiconductor component 102 combined with an ESD protection circuit 100 in an IC chip. In certain embodiments of the present disclosure, the GaN based semiconductor component 102 may be a GaN based HEMT, which is prone to cause the damage to the gate terminal because the voltage overshot surge exceeds the gate breakdown voltage. As illustrated in FIG. 1, the GaN based HEMT 102 has a gate G, a source S and a drain D; the drain D and source S of the GaN based HEMT 102 are respectively coupled to a first reference voltage VDD and a second reference voltage VSS. The ESD protection circuit 100 is coupled between the gate G and source S of the GaN based HEMT 102; under the normal operating voltage, the ESD protection circuit 100 is not activated, and the GaN based HEMT 102 may operate normally; yet, when the voltage overshot surge takes place during the component switching or during the occurrence of the electrostatic discharge surge, the ESD protection circuit 100 may be configured to provides the electrostatic discharge protection for the GaN based HEMT 102, thereby preventing the GaN based HEMT 102 from being damaged by the electrostatic discharge surge. In certain embodiments of the present disclosure, the ESD protection circuit 100 may be coupled to an output/input pin 124 in the IC chip directly. In certain embodiments of the present disclosure, there ore one or more other circuits between the ESD protection circuit 100 and the output/input pin 124 of the IC chip, such as a resistor component 126 or a driving circuit (not shown in FIG. 1) or other components.

Due to the characteristics of the component(s) used in the ESD protection circuit 100, the ESD protection circuit 100 comprises two parts, i.e., the ESD protection sub-circuit 100A and 100B, which respectively have different trigger voltages. The ESD protection sub-circuit 100A and ESD protection sub-circuit 100B are coupled in series by way of stacking; specifically, the ESD protection sub-circuit 100A is coupled between the gate G of the GaN based HEMT 102 and the ESD protection sub-circuit 100B, whereas the ESD protection sub-circuit 100B is coupled between the ESD protection sub-circuit 100A and the source S of the GaN based HEMT 102. In particular, the ESD protection sub-circuit 100A comprises a trigger circuit 112, a voltage divider 114 and a discharge component 116; in certain embodiments of the present disclosure, the voltage divider 114 may be a resistor, the discharge component 116 may be a GaN based transistor and have a threshold voltage Vt1, wherein the discharge component 116 comprises a first source/drain T1, a second source/drain T2 and a gate T3; when the voltage of the first source/drain T1 or the second source/drain T2 is greater than the voltage of the gate T3 and the difference therebetween exceeds the threshold voltage Vt1, the GaN based transistor 116 is turned on or conducts, and the first source/drain T1 of the GaN based transistor 116 is coupled to the gate G and the resistor component 126 of the GaN based HEMT 102.

The voltage divider 114 is coupled between the second source/drain T2 and gate T3 of the GaN based transistor 116. The trigger circuit 112 is coupled between the first source/drain T1 and gate T3 of the GaN based transistor 116, wherein the trigger circuit 112 has a first terminal T1 and a second terminal T2 that are respectively coupled to the first source/drain T1 and gate T3 of the GaN based transistor 116. As illustrated in FIG. 1, the ESD protection sub-circuit 100B may have a structure that is completely symmetrical to the ESD protection sub-circuit 100A and the two are coupled with each other. In particular, the ESD protection sub-circuit 100B comprises a trigger circuit 118, a voltage divider 120 and a discharge component 122. For example, voltage divider 120 may be a resistor, discharge component 122 may be a GaN based transistor and have a threshold voltage Vt3, wherein the discharge component 122 comprises a first source/drain T1, a second source/drain T2 and a gate T3; when the voltage of the first source/drain T1 or the second source/drain T2 is greater than the voltage of the gate T3 and the difference therebetween exceeds the threshold voltage Vt3, the GaN based transistor 122 may be turned on or conduct; the first source/drain T1 and second source/drain T2 of the GaN based transistor 122 are respectively coupled to the source S of the GaN based HEMT 102 and the second source/drain T2 of the GaN based transistor 116. The trigger circuit 118 is coupled between the first source/drain T1 and gate T3 of the GaN based transistor 122, wherein the trigger circuit 118 has a first terminal T1 and a second terminal T2 that are respectively coupled to the first source/drain T1 and gate T3 of the GaN based transistor 122.

When a positive electrostatic discharge surge passes through the output/input pin 124 and enters into the IC chip, the voltage of the first terminal T1 of the trigger circuit 112 is asserted upward, and the extent to which the voltage of the first terminal T1 of the trigger circuit 112 is asserted is greater than the voltage of the second terminal T2 and the difference therebetween exceeds a threshold voltage Vt2 of the trigger circuit 112, the trigger circuit 112 is turned on or conducts. When the voltage of the first terminal T1 of the trigger circuit 112 is continuously asserted upward, the voltage of the second terminal T2 of the trigger circuit 112 is further elevated until the voltage difference between the voltage of the second terminal T2 of the trigger circuit 118 and the second reference voltage VSS exceeds the threshold voltage Vt1 of the GaN based transistor 116; then the GaN based transistor 116 is turned on or conducts, thereby forming a first path from the output/input pin 124 of the IC chip via the trigger circuit 112, the voltage dividers 114 and 120 and the GaN based transistor 122 to the second reference voltage VSS. When the current passing through the first path is large enough so that the cross-voltage of the voltage divider 114 exceeds the threshold voltage Vt1 of the GaN based transistor 116, the GaN based transistor 116 is then turned on or conducts, thereby forming a second path from the output/input pin 124 of the IC chip via the GaN based transistors 116 and 122 to the second reference voltage VSS.

Since the GaN based transistors 116 and 122 are designed to be very robust, the second path is in fact the channel used to channel the electrostatic discharge surge. However, the design as shown in FIG. 1 is to connect the ESD protection sub-circuit 100A and 100B in series, wherein it is less common that both the GaN based transistors 116 and 122 are turned on or conduct completely; in other words, if a second discharge path allowing for a larger current passing therethrough is desired, the areas of the GaN based transistors 116 and 122 should be further elevated, thereby resulting in an economic waste of the chip size. As should be noted, when a negative electrostatic discharge surge passes through the output/input pin 124 and enters the IC chip, then the situation in operation would be completely opposite to the case discussed above in connection with the positive electrostatic discharge surge passing through the output/input pin 124 and entering into the IC chip; yet the issue regarding the difficulty in completely turning on or conducting the GaN based transistors 116 and 122 remains. Other embodiments of the present disclosure are provided so that it is feasible to address the above-mentioned issue without increasing the areas of the GaN based transistors 116 and 122.

Figure 2:
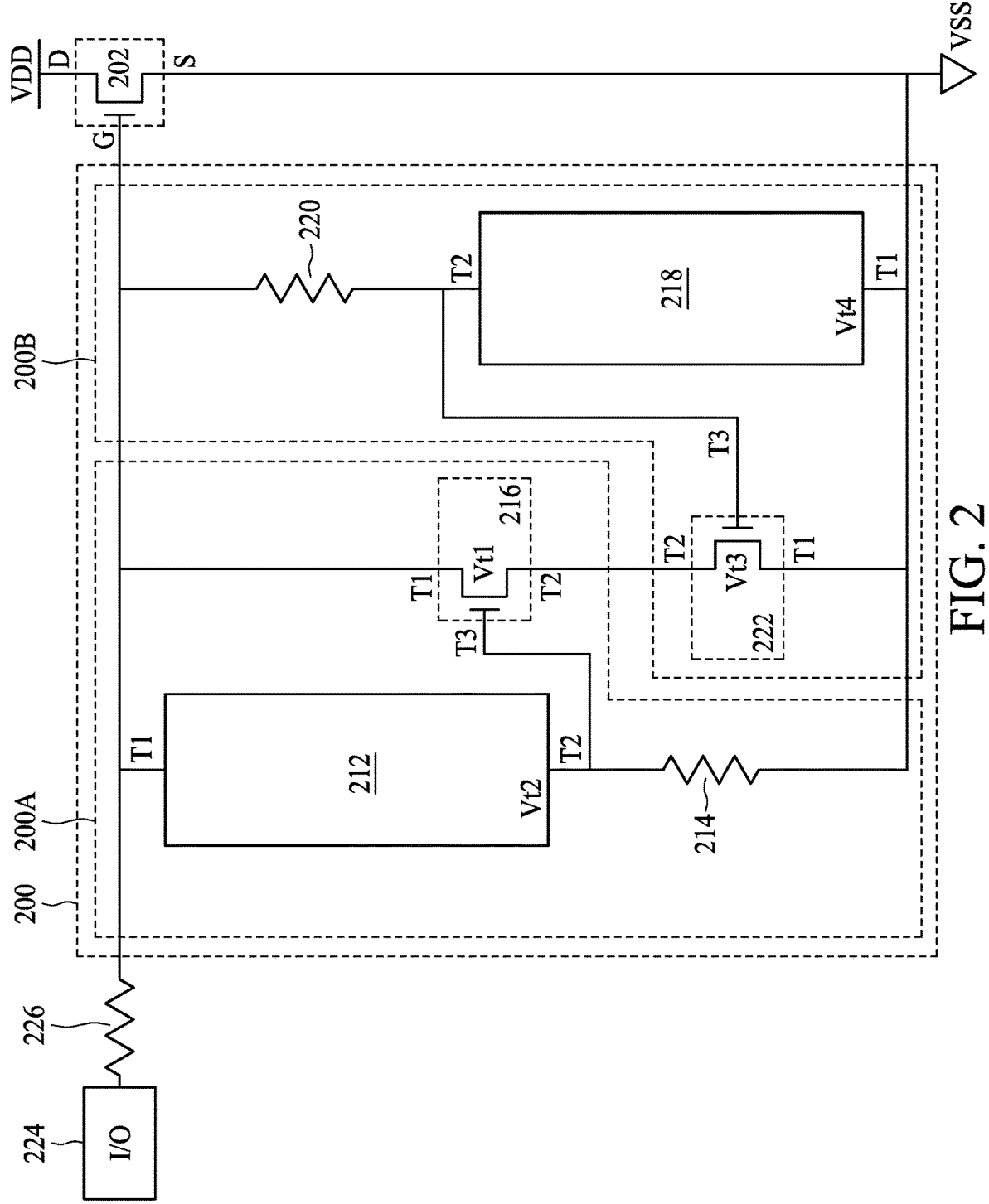
FIG. 2 is a schematic diagram illustrating a GaN based semiconductor component combined with an ESD protection circuit in an IC chip according to a first embodiment of the present invention.

Reference is made to FIG. 2, which is a schematic diagram illustrating a GaN based semiconductor component 202 combined with an ESD protection circuit 200 in an IC chip according to a first embodiment of the present disclosure. Similar to the IC chip of FIG. 1, the GaN based semiconductor component 202 of FIG. 2 may be a GaN based HEMT. As illustrated in FIG. 2, the GaN based HEMT 202 has a gate G, a source S and a drain D; the drain D and source S of the GaN based HEMT 202 are respectively coupled to a first reference voltage VDD and a second reference voltage VSS. The ESD protection circuit 200 is coupled between the gate G and source S of the GaN based HEMT 202; under the normal operating voltage, the ESD protection circuit 200 is not activated, and the GaN based HEMT 202 may operate normally, yet, when the voltage overshot surge takes place during the component switching or during the occurrence of the electrostatic discharge surge, the ESD protection circuit 200 may be configured to provides the electrostatic discharge protection for the GaN based HEMT 202, thereby preventing the GaN based HEMT 202 from being damaged by the electrostatic discharge surge. In certain embodiments of the present disclosure, the ESD protection circuit 200 may be coupled to an output/input pin 224 in the IC chip directly. In certain embodiments of the present disclosure, there ore one or more other circuits between the ESD protection circuit 200 and the output/input pin 224 of the IC chip, such as a resistor component 226 or a driving circuit (not shown in FIG. 2) or other components.

ESD protection circuit 200 comprises two parts, i.e., the ESD protection sub-circuit 200A and 200B that respectively having different trigger voltages. Unlike the ESD protection circuit 100, the ESD protection sub-circuit 200A and the ESD protection sub-circuit 200B are not coupled in series by way of stacking. Specifically, both the ESD protection sub-circuit 200A and 200B are coupled between the gate G and source S of the GaN based HEMT 202, except that the ESD protection sub-circuit 200A and 200B are oriented oppositely; in certain embodiments of the present disclosure, the ESD protection sub-circuit 200A and 200B may be symmetrical. In particular, the ESD protection sub-circuit 200A comprises a trigger circuit 212, a voltage divider 214 and a discharge component 216; in certain embodiments of the present disclosure, the voltage divider 214 may be a resistor, and the discharge component 216 may be a GaN based transistor and have a threshold voltage Vt1, wherein the discharge component 216 comprises a first source/drain T1, a second source/drain T2 and a gate T3; when the voltage of the first source/drain T1 or the second source/drain T2 is greater than the voltage of the gate T3 and the difference therebetween exceeds the threshold voltage Vt1, the GaN based transistor 216 may be turned on or conduct; the first source/drain T1 of the GaN based transistor 216 is coupled to the gate G of the GaN based HEMT 202 and resistor component 226.

The voltage divider 214 is coupled between the gate T3 of the GaN based transistor 216 and the second reference voltage VSS. The trigger circuit 212 is coupled between the first source/drain T1 and gate T3 of the GaN based transistor 216, wherein the trigger circuit 212 has a first terminal T1 and a second terminal T2 that are respectively coupled to the first source/drain T1 and gate T3 of the GaN based transistor 216. As illustrated in FIG. 2, the ESD protection sub-circuit 200B may have a structure that is completely symmetrical to the structure of the ESD protection sub-circuit 100A. In particular, the ESD protection sub-circuit 200B comprises a trigger circuit 218, a voltage divider 220 and a discharge component 222. For example, the voltage divider 220 may be a resistor, and the discharge component 222 may be a GaN based transistor and have a threshold voltage Vt3, wherein the discharge component 222 comprises a first source/drain T1, a second source/drain T2 and a gate T3; when the voltage of the first source/drain T1 or the second source/drain T2 is greater than the voltage of the gate T3 and the difference therebetween exceeds the threshold voltage Vt3, the GaN based transistor 222 may be turned on or conduct; the first source/drain T1 and the second source/drain T2 of the GaN based transistor 222 are respectively coupled to the source S of the GaN based HEMT 202 and the second source/drain T2 of the GaN based transistor 216. The trigger circuit 218 is coupled between the first source/drain T1 and the gate T3 of the GaN based transistor 222, wherein the trigger circuit 218 has a first terminal T1 and a second terminal T2 that are respectively coupled to the first source/drain T1 and the gate T3 of the GaN based transistor 222. In other words, the trigger circuit 218 and the trigger circuit 212 are in parallel connection.

Figure 3:
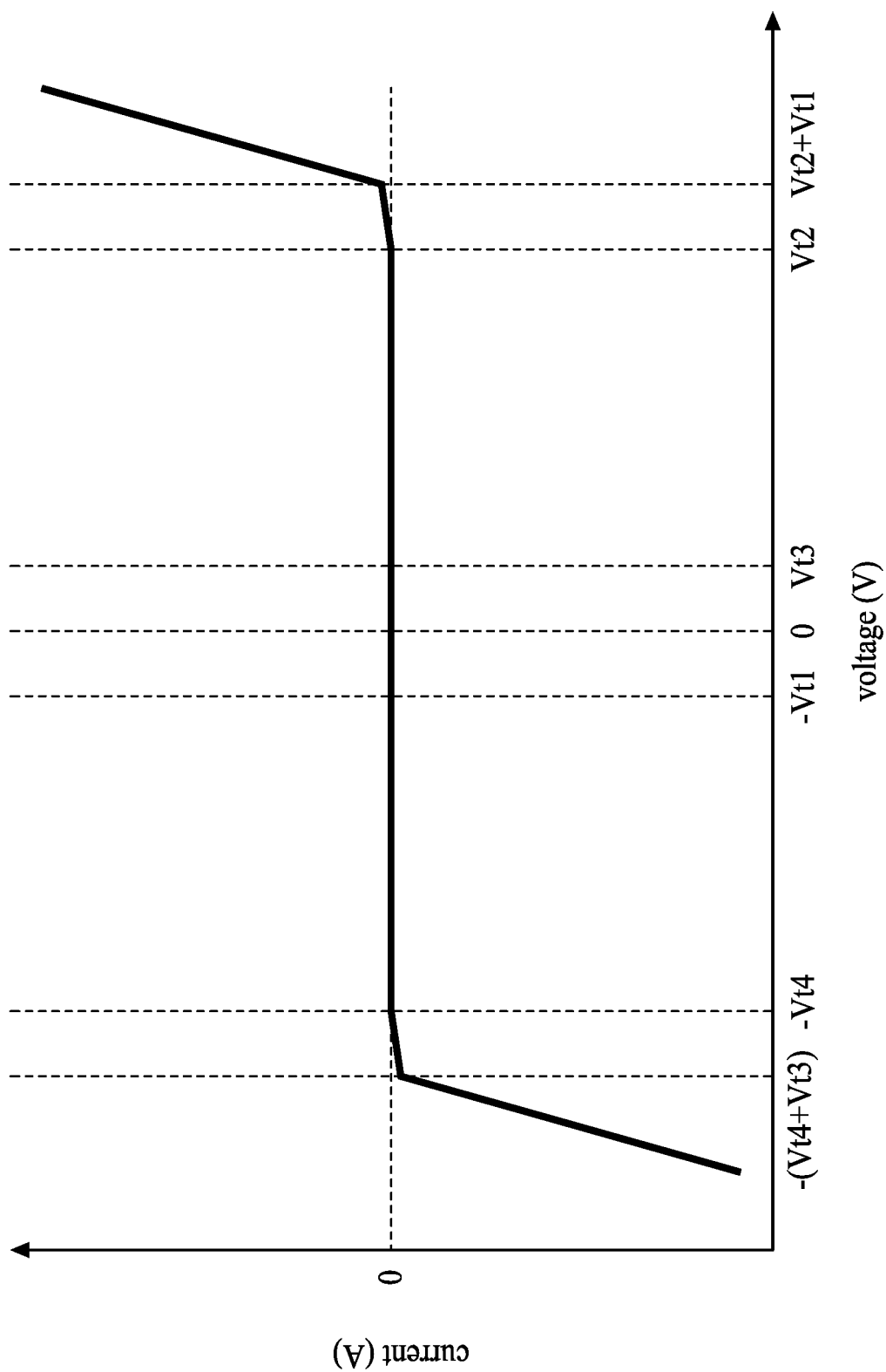
FIG. 3 is a schematic diagram illustrating the relationship between the operating voltage and current of the ESD protection circuit.

Reference is made to FIG. 2 and FIG. 3 simultaneously, FIG. 3 is a schematic diagram illustrating the relationship between the operating voltage and current of the ESD protection circuit 200, in which the horizontal axis represents the voltage of the gate G of the GaN based semiconductor component 202, whereas the vertical axis represents the current flowing through the ESD protection circuit 200. When a positive electrostatic discharge surge passes through the output/input pin 224 and enters into the IC chip, the voltage of the first terminal T1' of the trigger circuit 212 and the voltage of the gate T3 of the GaN based transistor 222 are asserted upward; since the threshold voltage Vt3 of the GaN based transistor 222 is set to be lower than the threshold voltage Vt2 of the trigger circuit 212, the electrostatic discharge surge would first turn on or conduct the GaN based transistor 222; however, since the mere turning-on or conduction of the GaN based transistor 222 does not result in a complete conduction path from the output/input pin 224 to the second reference voltage VSS, therefore, there is no current flowing through the GaN based transistor 222 at this moment. The trigger circuit 212 would not conduct until the voltage of the first terminal T1 of the trigger circuit 212 is asserted upward and the voltage difference exceeds the threshold voltage Vt2 of the trigger circuit 212.

When the trigger circuit 212 conducts, a first path from the output/input pin 224 via the trigger circuit 212 and the voltage divider 214 to the second reference voltage VSS is formed; since the voltage divider 214 is designed to have a greater resistance, the current flowing through the first path is smaller; as illustrated in FIG. 3, when the voltage is between Vt2 and Vt2+Vt1, the first path conducts and the current starts flowing therethrough. When the voltage of the first terminal T1 of the trigger circuit 212 is asserted upward continuously, the voltage of the second terminal T2 of the trigger circuit 212 is further elevated until the voltage difference between the gate T3 and the second source/drain T2 of the GaN based transistor 216 exceeds the threshold voltage Vt1 of the GaN based transistor 216, the GaN based transistor 216 is then turned on or conducts, at this time, the voltage of the first terminal T1 of the trigger circuit 212 should exceed Vt2+Vt1.

Since the GaN based transistor 222 has conducted already, when the GaN based transistor 216 conducts, a second path from the output/input pin 124 of the IC chip via the GaN based transistor 216 and GaN based transistor 222 to the second reference voltage VSS is formed. Since the GaN based transistors 216 and 222 are designed to be very robust, that is, they have a larger area, the second path is in fact the one used to channel the electrostatic discharge surge; more importantly, in the present embodiment, the GaN based transistors 216 and 222 could be completely turned on or conduct simultaneously; that is, as compared with the approach depicted in FIG. 1, if the GaN based transistors 116 and 122 in the ESD protection circuit 100 have the same size as the size of the GaN based transistors 216 and 222, the ESD protection circuit 200 may allow for the passage of larger current.

As should be noted, when a negative electrostatic discharge surge passes through the output/input pin 124 and enters the IC chip, then the situation in operation would be completely opposite to the case discussed above in connection with the positive electrostatic discharge surge passing through the output/input pin 124 and entering into the IC chip; that is, the GaN based transistor 216 is first turned on or conducts, then the trigger circuit 218 is turned on, and lastly, when the GaN based transistor 222 conducts, the second path conducts to channel the electrostatic discharge surge.

Figure 4:
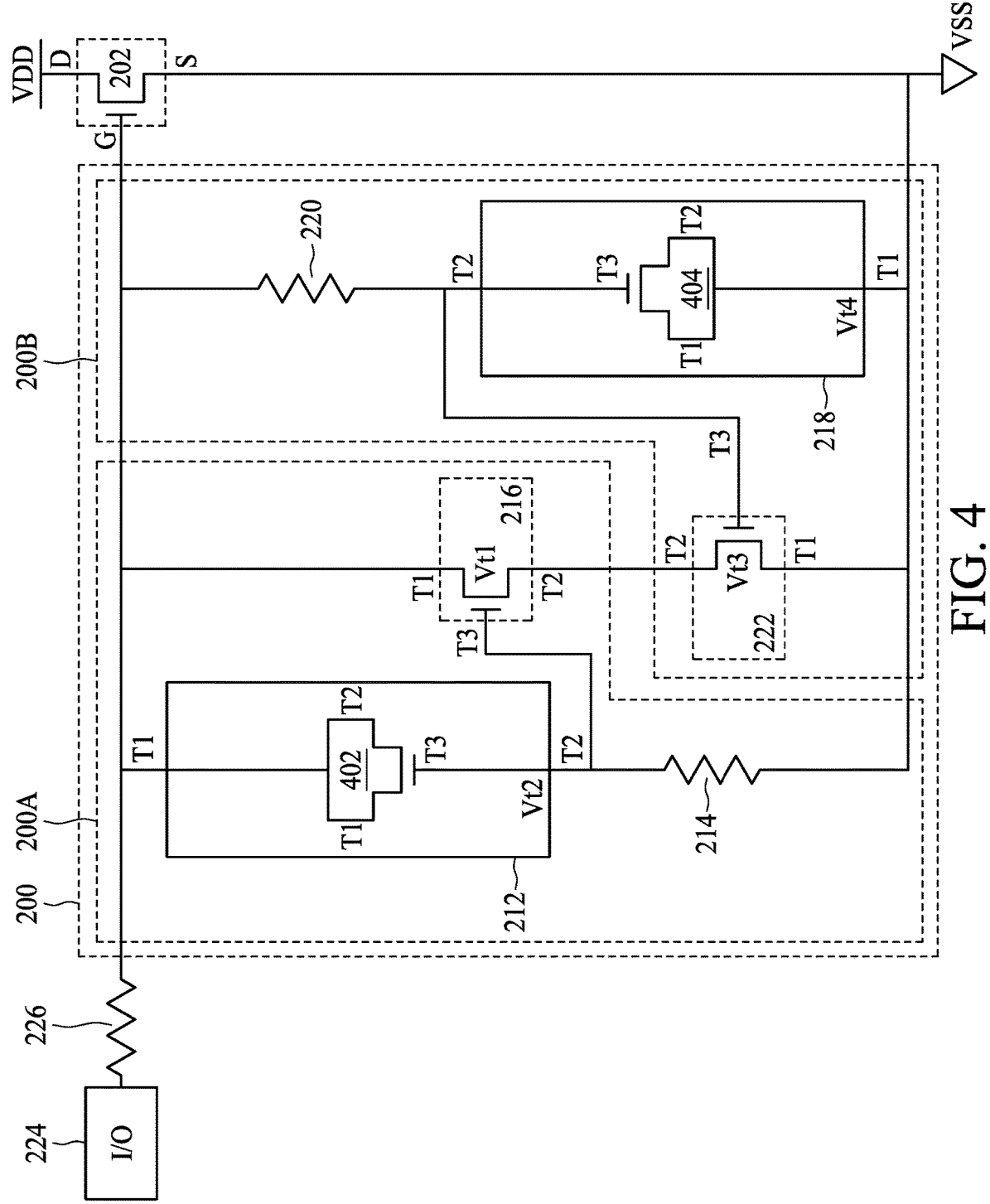
FIG. 4 is a schematic diagram illustrating a detailed embodiment of the present invention of the ESD protection circuit.

FIG. 4 is a schematic diagram illustrating one detailed embodiment of the ESD protection circuit 200 according to the present disclosure. In particular, the trigger circuit 212 comprises a capacitor formed by the GaN based transistor 402, and the GaN based transistor 402 comprises a first source/drain T1, a second source/drain T2 and gate T3, wherein the gate T3 of the GaN based transistor 402 is coupled to the gate T3 of the GaN based transistor 216, and the first source/drain T1 of the GaN based transistor 402 is coupled to the second source/drain T2, and further coupled to the gate G of the GaN based transistor 202. On the other hand, the trigger circuit 218 comprises a capacitor formed by the GaN based transistor 404, and the GaN based transistor 404 comprises a first source/drain T1, a second source/drain T2 and a gate T3, wherein the gate T3 of the GaN based transistor 404 is coupled to the gate T3 of the GaN based transistor 222, the first source/drain T1 of the GaN based transistor 404 is coupled to the second source/drain T2, and further coupled to the second reference voltage VSS.

Figure 5:
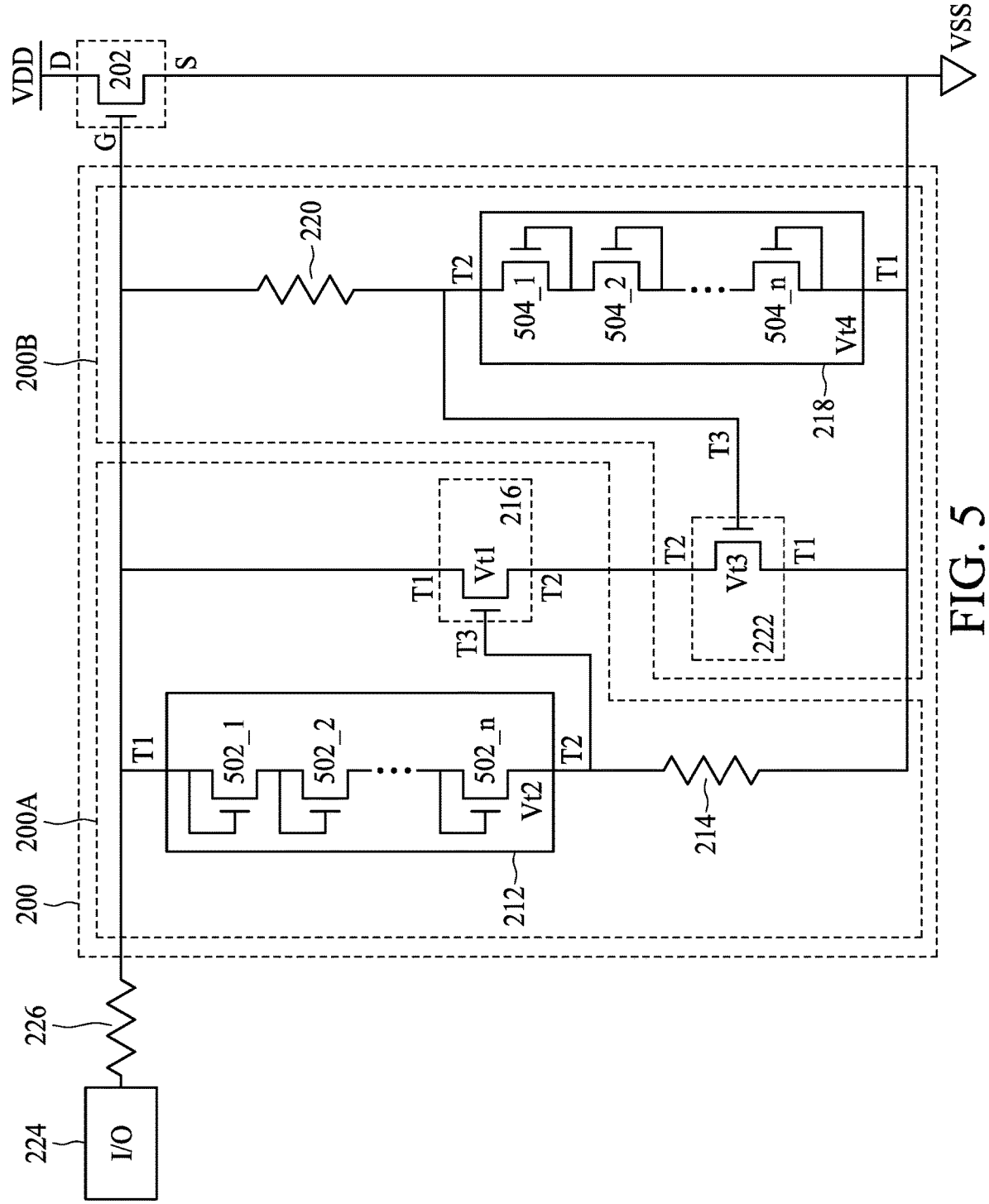
FIG. 5 is a schematic diagram illustrating another detailed embodiment of the present invention of the ESD protection circuit.

FIG. 5 is a schematic diagram illustrating another detailed embodiment of the ESD protection circuit 200 according to the present disclosure. In particular, the trigger circuit 212 comprises a plurality of GaN based transistors 502_1, 502_2, ..., 502_n that are in series connection with one another, wherein n is an integer greater than 1, and gate and source of the GaN based transistors 502_1, 502_2, ..., 502_n are coupled with each other; for example, the gate of the GaN based transistor 502_1 is coupled to the source, and further coupled to the gate G of the GaN based transistor 202; the gate of the GaN based transistor 502_2 is coupled to the source, and further coupled to the drain of the GaN based transistor 502_1; the gate of the GaN based transistor 502_n is coupled to the source, and the drain of the GaN based transistor 502_n is coupled to the gate T3 of the GaN based transistor 216. The trigger circuit 218 comprises a plurality of GaN based transistors 504_1, 504_2, ..., 504_n that are in series connection with one another, wherein n is an integer is greater than 1, and the gate and source of the GaN based transistor 504_1, 504_2, ..., 504_n are coupled with each other; for example, the gate of the GaN based transistor 504_1 is coupled to the source, and further coupled to the drain of the GaN based transistor 504_2, and the drain of the GaN based transistor 504_1 is coupled to the gate T3 of the GaN based transistor 222; the gate of the GaN based transistor 504_2 is coupled to the source, and the gate of the GaN based transistor 504_n is coupled to the source, and further coupled to the second reference voltage VSS.

Figure 6:
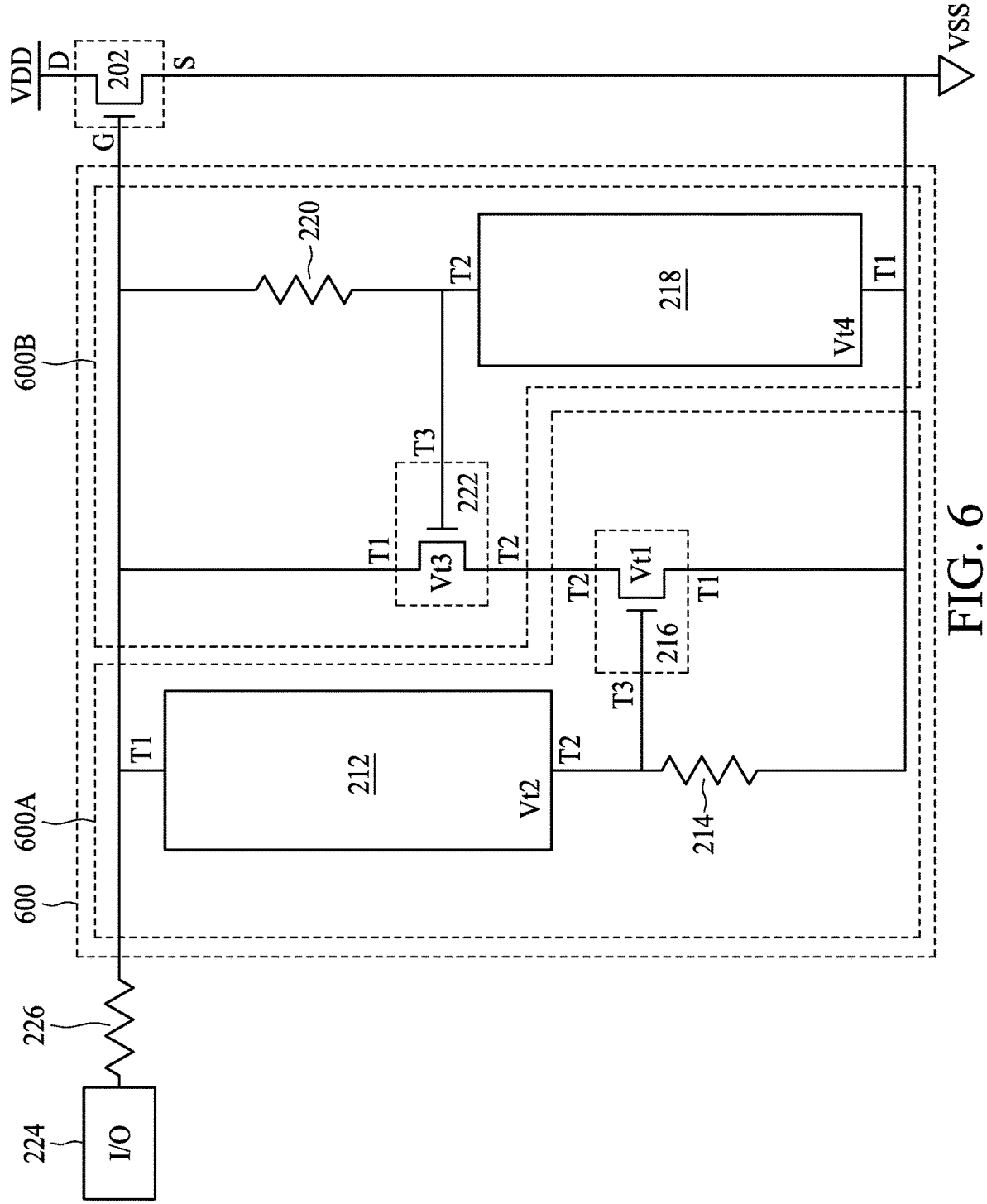
FIG. 6 is a schematic diagram illustrating a GaN based semiconductor component combined with an ESD protection circuit in an IC chip according to a second embodiment of the present invention.

FIG. 6 is a schematic diagram illustrating a GaN based semiconductor component 202 combined with an ESD protection circuit 600 in an IC chip according to a second embodiment of the present disclosure. The difference between FIG. 6 and FIG. 2 is that the ESD protection circuit 600 is used to replace the ESD protection circuit 200.

Similarly, when operating under the normal operating voltage, the ESD protection circuit 600 will not be activated, while the GaN based HEMT 202 may operate normally; but when the voltage overshot surge occurs during component switch or when the electrostatic discharge surge takes place, the ESD protection circuit 600 is configured to provides the electrostatic discharge protection for the GaN based HEMT 202, such that the GaN based HEMT 202 is prevented from being damaged by the electrostatic discharge surge.

The ESD protection circuit 600 comprises two parts, i.e., the ESD protection sub-circuit 600A and 600B that respectively have different trigger voltages. In certain embodiments of the present disclosure, the ESD protection circuit 600 and the ESD protection circuit 200 may have the exact identical components yet with different connections among the components. For example, the ESD protection sub-circuit 600A comprises the trigger circuit 212, the voltage divider 214 and the discharge component 216 of the ESD protection sub-circuit 200A, and the first source/drain T1 of the GaN based transistor 216 is coupled to the second reference voltage VSS.

The voltage divider 214 is coupled between the gate T3 of the GaN based transistor 216 and second reference voltage VSS. The trigger circuit 212 has a first terminal T1 and a second terminal T2 that are respectively coupled to the gate G of the GaN based transistor 202 and the gate T3 of the GaN based transistor 216. As illustrated in FIG. 6, the ESD protection sub-circuit 600B may have a structure that is completely symmetrical to the structure of the ESD protection sub-circuit 600A. In particular, the ESD protection sub-circuit 600B comprises the trigger circuit 218, the voltage divider 220 and the discharge component 222. The first source/drain T1 and second source/drain T2 of the GaN based transistor 222 are respectively coupled to the gate G of the GaN based HEMT 202 and the second source/drain T2 of the GaN based transistor 216. The trigger circuit 218 has a first terminal T1 and a second terminal T2 that are respectively coupled to the second reference voltage VSS and the gate T3 of the GaN based transistor 222. The trigger circuit 218 and the trigger circuit 212 are in parallel connection.

The schematic diagram showing the relationship between operating voltage and current of the ESD protection circuit 600 may be the same as that of the ESD protection circuit 200; therefore, reference is made to both FIG. 6 and FIG. 3; in this case, the horizontal axis of FIG. 3 represents the voltage of the gate G of the GaN based semiconductor component 202, whereas the vertical axis represents the current passing through the ESD protection circuit 600. When a positive electrostatic discharge surge passes through the output/input pin 224 and enters into the IC chip, the voltage of the first terminal T1 of the trigger circuit 212 and the voltage of the gate T3 of the GaN based transistor 222 are asserted upward; since the threshold voltage Vt3 of the GaN based transistor 222 is set to be lower than the threshold voltage Vt2 of the trigger circuit 212, the electrostatic discharge surge would first turn on or conduct the GaN based transistor 222; however, since the mere turning-on or conduction of the GaN based transistor 222 does not result in a complete conduction path from the output/input pin 224 to the second reference voltage VSS, therefore, there is no current flowing through the GaN based transistor 222 at this moment. The trigger circuit 212 would not conduct until the voltage of the first terminal T1 of the trigger circuit 212 is asserted upward and the voltage difference exceeds the threshold voltage Vt2 of the trigger circuit 212.

When the trigger circuit 212 conducts, a first path from the output/input pin 224 via the trigger circuit 212 and the voltage divider 214 to the second reference voltage VSS is formed; since the voltage divider 214 is designed to have a greater resistance, the current flowing through the first path is smaller; as illustrated in FIG. 3, when the voltage is between Vt2 and Vt2+Vt1, the first path conducts and the current starts flowing therethrough. When the voltage of the first terminal T1 of the trigger circuit 212 is asserted upward continuously, the voltage of the second terminal T2 of the trigger circuit 212 is further elevated until the voltage difference between the gate T3 and the first source/drain T1 of the GaN based transistor 216 exceeds the threshold voltage Vt1 of the GaN based transistor 216, the GaN based transistor 216 is then turned on or conducts, at this time, the voltage of the first terminal T1 of the trigger circuit 212 should exceed Vt2+Vt1.

Since the GaN based transistor 222 has conducted already, when the GaN based transistor 216 conducts, a second path from the output/input pin 124 of the IC chip via the GaN based transistor 216 and GaN based transistor 222 to the second reference voltage VSS is formed. Since the GaN based transistors 216 and 222 are designed to be very robust, that is, they have a larger area, the second path is in fact the one used to channel the electrostatic discharge surge; more importantly, in the present embodiment, the GaN based transistors 216 and 222 could be completely turned on or conduct simultaneously; that is, as compared with the approach depicted in FIG. 1, if the GaN based transistors 116 and 122 in the ESD protection circuit 100 have the same size as the size of the GaN based transistors 216 and 222, the ESD protection circuit 200 may allow for the passage of larger current.

As should be noted, when a negative electrostatic discharge surge passes through the output/input pin 124 and enters the IC chip, then the situation in operation would be completely opposite to the case discussed above in connection with the positive electrostatic discharge surge passing through the output/input pin 124 and entering into the IC chip; that is, the GaN based transistor 216 is first turned on or conducts, then the trigger circuit 218 is turned on, and lastly, when the GaN based transistor 222 conducts, the second path conducts to channel the electrostatic discharge surge. As should be noted, the trigger circuits 212 and 218 in FIG. 4 and FIG. 5 are also applicable in the embodiments of FIG. 6.

Some embodiments of the present disclosure provide an electrostatic discharge (ESD) protection circuit configured to protect a Gallium nitride (GaN) based high electron mobility transistor (HEMT). The GaN based HEMT includes a gate, a drain and a source. The electrostatic discharge protection circuit includes: a first sub-circuit, including: a first trigger circuit, including a first terminal and a second terminal, wherein the first terminal is coupled to the gate of the GaN based HEMT; a first voltage divider, coupled between the second terminal of the first trigger circuit and the source of the GaN based HEMT; and a first discharge component, including a gate, a first source/drain and a second source/drain, wherein the first source/drain is coupled to the gate of the GaN based HEMT, the gate is coupled to the second terminal of the first trigger circuit.

Some embodiments of the present disclosure provide an ESD protection circuit, coupled between a first reference terminal and a second reference terminal. The electrostatic discharge protection circuit includes: a first voltage divider; a second voltage divider; a first trigger circuit, including a first terminal and a second terminal, wherein the first terminal is coupled to the first reference terminal, the second terminal is coupled to the second reference terminal via the first voltage divider; a second trigger circuit, including a first terminal and a second terminal, wherein the first terminal is coupled to the second reference terminal, the second terminal is coupled to the first reference terminal via the second voltage divider, and the second trigger circuit and the first trigger circuit are in parallel connection; a first discharge component, including a gate, a first source/drain and a second source/drain, wherein the gate is coupled between the first trigger circuit and the first voltage divider; and a second discharge component, including a gate, a first source/drain and a second source/drain, wherein the gate is coupled between the second trigger circuit and the second voltage divider, and the first discharge component and the second are in series connection.

Some embodiments of the present disclosure provide a semiconductor circuit, including: a GaN based HEMT, comprising a gate, a drain and a source, wherein the drain is coupled to a first reference voltage, and the source is coupled to a second reference voltage; and a first sub-circuit, including: a first trigger circuit, including a first terminal and a second terminal, wherein the first terminal coupled to the gate of the GaN based HEMT; a first voltage divider, coupled between the second terminal of the first trigger circuit and the source of the GaN based HEMT; and a first discharge component, including a gate, a first source/drain and a second source/drain, wherein the first source/drain is coupled to the source of the GaN based HEMT, and the gate is coupled to the second terminal of the first trigger circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of embodiments of the present invention, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods, or steps.

What is claimed is:

1. An electrostatic discharge (ESD) protection circuit, configured to protect a Gallium nitride (GaN) based high electron mobility transistor (HEMT), wherein the GaN based HEMT comprises a gate, a drain and a source, the electrostatic discharge protection circuit comprising:
 a first sub-circuit, comprising:

a first trigger circuit, comprising a first terminal and a second terminal, wherein the first terminal is coupled to the gate of the GaN based HEMT;

a first voltage divider, coupled between the second terminal of the first trigger circuit and the source of the GaN based HEMT; and a first discharge component, comprising a gate, a first source/drain and a second source/drain, wherein the first source/drain is coupled to the gate of the GaN based HEMT, the gate is coupled to the second terminal of the first trigger circuit; and a second sub-circuit, comprising:

a second discharge component, comprising a gate, a first source/drain and a second source/drain, wherein the first source/drain is coupled to the source of the GaN based HEMT, and the gate is coupled to the second terminal of the second trigger circuit;

wherein the first trigger circuit and the first voltage divider as a whole and the first discharge component and the second discharge component as a whole are parallel connected to each other.

2. The ESD protection circuit of claim 1, wherein the second sub-circuit further comprises:

a second trigger circuit, comprising a first terminal and a second terminal, wherein the first terminal is coupled to the source of the GaN based HEMT; and a second voltage divider, coupled between the second terminal of the second trigger circuit and the gate of the GaN based HEMT.

3. The ESD protection circuit of claim 2, wherein the second source/drain of the second discharge component is coupled to the second source/drain of the first discharge component.

4. The ESD protection circuit of claim 2, wherein the first voltage divider comprises a first resistor, and the second voltage divider comprises a second resistor.

5. The ESD protection circuit of claim 2, wherein the first discharge component comprises a first GaN based transistor, and the second discharge component comprises a second GaN based transistor.

6. The ESD protection circuit of claim 1, wherein the first trigger circuit has a threshold voltage, and when a voltage of the first terminal of the first trigger circuit is higher than a voltage of the second terminal of the first trigger circuit and a difference therebetween exceeds the threshold voltage of the first trigger circuit, the first trigger circuit conducts; and the first discharge component has a threshold voltage, and when a voltage of the gate of the first discharge component is higher than a voltage of the first source/drain or the second source/drain and a difference therebetween exceeds the threshold voltage of the first discharge component, the first discharge component conducts, and the threshold voltage of the first trigger circuit is greater than the threshold voltage of the first discharge component.

7. The ESD protection circuit of claim 2, wherein the second trigger circuit has a threshold voltage, when a voltage of the first terminal of the second trigger circuit is higher than a voltage of the second terminal and a difference therebetween exceeds the threshold voltage of the second trigger circuit, the second trigger circuit conducts; and the second discharge component has a threshold voltage, and when a voltage of the gate of the second discharge component is higher than a voltage of the first source/drain or the second source/drain and a difference therebetween exceeds the threshold voltage of the second discharge component, the second discharge component conducts, and the threshold voltage of the second trigger circuit is greater than the threshold voltage of the second discharge component.

8. An ESD protection circuit, coupled between a first reference terminal and a second reference terminal, the electrostatic discharge protection circuit comprising:

a first voltage divider;

a second voltage divider;

a first trigger circuit, comprising a first terminal and a second terminal, wherein the first terminal is coupled to the first reference terminal, the second terminal is coupled to the second reference terminal via the first voltage divider, wherein the first trigger circuit has a threshold voltage, and when a voltage of the first terminal of the first trigger circuit is higher than a voltage of the second terminal and a difference therebetween exceeds the threshold voltage of the first trigger circuit, the first trigger circuit conducts;

a second trigger circuit, comprising a first terminal and a second terminal, wherein the first terminal is coupled to the second reference terminal, the second terminal is coupled to the first reference terminal via the second voltage divider, and the second trigger circuit and the first trigger circuit are in parallel connection;

a first discharge component, comprising a gate, a first source/drain and a second source/drain, wherein the gate is coupled between the first trigger circuit and the first voltage divider; and a second discharge component, comprising a gate, a first source/drain and a second source/drain, wherein the gate is coupled between the second trigger circuit and the second voltage divider, and the first discharge component and the second are in series connection.

9. The ESD protection circuit of claim 8, wherein the first source/drain of the first discharge component is coupled to the first reference terminal, the first source/drain of the second discharge component is coupled to the second reference terminal, and the second source/drain of the first discharge component is coupled to the second source/drain of the second discharge component.

10. The ESD protection circuit of claim 8, wherein the first voltage divider comprises a first resistor, and the second voltage divider comprises a second resistor.

11. The ESD protection circuit of claim 8, wherein the first discharge component comprises a first GaN based transistor, and the second discharge component comprises a second GaN based transistor.

12. The ESD protection circuit of claim 8, wherein the first discharge component has a threshold voltage, and when a voltage of the gate of the first discharge component is higher than a voltage of the first source/drain or the second source/drain and a difference therebetween exceeds the threshold voltage of the first discharge component, the first discharge component conducts, and the threshold voltage of the first trigger circuit is greater than the threshold voltage of the first discharge component.

13. The ESD protection circuit of claim 8, wherein the second trigger circuit has a threshold voltage, when a voltage of the first terminal of the second trigger circuit is higher than a voltage of the second terminal and a difference therebetween exceeds the threshold voltage of the second trigger circuit, the second trigger circuit conducts; and the second discharge component has a threshold voltage, and when a voltage of the gate of the second discharge component is higher than a voltage of the first source/drain or the second source/drain and a difference therebetween exceeds the threshold voltage of the second discharge component, the second discharge component conducts, and the threshold voltage of the second trigger circuit is greater than the threshold voltage of the second discharge component.

14. The ESD protection circuit of claim 8, wherein the first trigger circuit comprises a third GaN based transistor comprising a first source/drain, a second source/drain and a gate, wherein the first source/drain and the second source/drain of the third GaN based transistor are coupled to the first terminal of the first trigger circuit, and the gate of the third GaN based transistor is coupled to the second terminal of the first trigger circuit; and the second trigger circuit comprises a fourth GaN based transistor, comprising a first source/drain, a second source/drain and a gate, wherein the first source/drain and the second source/drain of the fourth GaN based transistor are coupled to the first terminal of the second trigger circuit, and the gate of the fourth GaN based transistor is coupled to the second terminal of the second trigger circuit.

15. The ESD protection circuit of claim 8, wherein the first trigger circuit comprises a plurality of GaN based transistors, wherein each GaN based transistor comprises a source, a drain and a gate, and the source of each GaN based transistor is coupled to the gate, and the plurality of GaN based transistors are in series connection; and the second trigger circuit comprises a plurality of GaN based transistor, wherein each GaN based transistor comprises a source, a drain and a gate, and the source of each GaN based transistor is coupled to the gate, and the plurality of GaN based transistors are in series connection.

16. A semiconductor circuit, comprising:
a GaN based HEMT, comprising a gate, a drain and a source, wherein the drain is coupled to a first reference voltage, and the source is coupled to a second reference voltage; and
a first sub-circuit, comprising:
a first trigger circuit, comprising a first terminal and a second terminal, wherein the first terminal coupled to the gate of the GaN based HEMT;
a first voltage divider, coupled between the second terminal of the first trigger circuit and the source of the GaN based HEMT; and
a first discharge component, comprising a gate, a first source/drain and a second source/drain, wherein the first source/drain is coupled to the source of the GaN based HEMT, and the gate is coupled to the second terminal of the first trigger circuit; and
a second sub-circuit, comprising:
a second discharge component, comprising a gate, a first source/drain and a second source/drain, wherein the first source/drain is coupled to the gate of the GaN based HEMT, and the gate is coupled to the second terminal of the second trigger circuit;
wherein the first trigger circuit and the first voltage divider as a whole and the first discharge component and the second discharge component as a whole are parallel connected to each other.

17. The semiconductor circuit of claim 16, wherein the second sub-circuit further comprises:
a second trigger circuit, comprising a first terminal and a second terminal, wherein the first terminal is coupled to the source of the GaN based HEMT; and
a second voltage divider, coupled between the second terminal of the second trigger circuit and the gate of the GaN based HEMT.

18. The semiconductor circuit of claim 17, wherein the second source/drain of the second discharge component is coupled to the second source/drain of the first discharge component.

19. The semiconductor circuit of claim 17, further comprising an output/input pin and a resistor component, wherein the output/input pin is coupled to the gate of the GaN based HEMT via the resistor component.

20. The semiconductor circuit of claim 17, wherein the first discharge component comprises a first GaN based transistor, and the second discharge component comprises a second GaN based transistor.

* * * * *